United States Patent
Kato (10) Patent No.: US 9,670,002 B2
(45) Date of Patent: Jun. 6, 2017

(54) CONVEYOR DEVICE

(71) Applicant: Murata Machinery, Ltd., Kyoto-shi, Kyoto (JP)

(72) Inventor: Susumu Kato, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 0 days.

(21) Appl. No.: 15/030,343

(22) PCT Filed: Sep. 29, 2014

(86) PCT No.: PCT/JP2014/075930
§ 371 (c)(1),
(2) Date: Apr. 18, 2016

(87) PCT Pub. No.: WO2015/064268
PCT Pub. Date: May 7, 2015

(65) Prior Publication Data
US 2016/0236872 A1    Aug. 18, 2016

(30) Foreign Application Priority Data

Oct. 28, 2013    (JP) .................................. 2013-223475

(51) Int. Cl.
B65G 47/24 (2006.01)
B65G 47/54 (2006.01)
(Continued)

(52) U.S. Cl.
CPC ............. B65G 37/02 (2013.01); B65G 35/06 (2013.01); B65G 37/005 (2013.01);
(Continued)

(58) Field of Classification Search
CPC .. B65G 47/24; B65G 47/244; B65G 47/2445; B65G 47/54; B65G 47/64; B65G 47/80
(Continued)

(56) References Cited

U.S. PATENT DOCUMENTS 4,457,419 A * 7/1984 Ogami .............. H01L 21/67706
198/345.1
5,141,095 A * 8/1992 Kamp .................. B65H 67/064
198/409
(Continued)

FOREIGN PATENT DOCUMENTS

JP    S58-041725    3/1983
JP    H3-281186 A   12/1991
(Continued)

OTHER PUBLICATIONS

English language translation of International Search Report dated Dec. 22, 2014 issued in corresponding PCT application PCT/JP2014/075930 cites the foreign patent documents listed above.

(Continued)

*Primary Examiner* — Douglas Hess
(74) *Attorney, Agent, or Firm* — DLA Piper LLP (US)

(57) ABSTRACT

A conveyor device includes: a first conveyor unit including a first supporting-and-conveying unit configured to convey the object; a turning unit configured to turn the first conveyor unit to change a traveling direction of the object; and a second conveyor unit including a pair of second supporting-and-conveying units provided adjacently to the first conveyor unit and configured to convey the object. The pair of the second supporting-and-conveying units and a driving-force transmitting unit configured to transmit driving force to the pair of the second supporting-and-conveying units are provided outside turning areas of the first conveyor unit in plan view. The first conveyor unit and the second conveyor unit are disposed so that a conveying area of the object in the second conveyor unit and the turning areas of the first conveyor unit overlap each other in plan view.

7 Claims, 5 Drawing Sheets

(51) Int. Cl.
*B65G 47/64* (2006.01)
*B65G 47/80* (2006.01)
*B65G 37/02* (2006.01)
*B65G 35/06* (2006.01)
*H01L 21/677* (2006.01)
*B65G 37/00* (2006.01)

(52) U.S. Cl.
CPC .... *H01L 21/6773* (2013.01); *H01L 21/67715* (2013.01); *B65G 2201/0297* (2013.01)

(58) Field of Classification Search
USPC .......................... 198/410, 411, 412, 413, 414
See application file for complete search history.

(56) References Cited

U.S. PATENT DOCUMENTS

| | | | | |
|---|---|---|---|---|
| 5,341,911 A * | 8/1994 | Gamberini | ........... | B65G 47/252 198/407 |
| 6,223,886 B1 * | 5/2001 | Bonora | ................. | B65G 13/04 198/465.2 |
| 6,308,818 B1 * | 10/2001 | Bonora | ................. | B65G 19/02 198/414 |
| 6,907,983 B2 * | 6/2005 | Freudelsperger | ...... | B65G 35/06 198/463.3 |
| 7,600,629 B2 * | 10/2009 | Skljarow | ................ | B65G 35/06 198/346.1 |
| 8,061,500 B2 * | 11/2011 | Baccini | ................. | H01L 21/681 198/345.1 |
| 8,312,981 B2 * | 11/2012 | Franz | ..................... | B65G 47/54 198/370.09 |
| 8,327,997 B2 * | 12/2012 | Hamao | ................ | B65G 47/244 198/379 |
| 8,550,228 B1 * | 10/2013 | Wei | ...................... | B65G 47/244 198/411 |
| 8,776,983 B2 * | 7/2014 | Yang | .................... | B65G 47/244 198/412 |
| 9,221,622 B2 * | 12/2015 | Morency | ............. | B65G 41/002 |
| 2007/0186799 A1 | 8/2007 | Kyutoku et al. | | |

FOREIGN PATENT DOCUMENTS

| | | |
|---|---|---|
| JP | H6-002527 B2 | 1/1994 |
| JP | 4178835 B2 | 9/2008 |
| TW | M324648 | 1/2008 |

OTHER PUBLICATIONS

International Preliminary Report on Patentability dated May 12, 2016, issued in corresponding International Application No. PCT/JP2014/075930.
Written Opinion of the International Searching Authority dated Dec. 22, 2014, issued in corresponding International Application No. PCT/JP2014/075930.
Office Action dated Nov. 30, 2016 issued in corresponding Chinese Patent Application No. 201480057228.2 cites the United States patent document above.

* cited by examiner

CONVEYOR DEVICE

CROSS REFERENCE TO RELATED APPLICATIONS

This application is a national stage of international application no. PCT/JP2014/075930, filed on Sep. 29, 2014, and claims the benefit of priority under 35 U.S.C 119 of Japanese application no. 2013-223475, filed on Oct. 28, 2013, both of which are incorporated herein by reference in their entirety.

TECHNICAL FIELD

The present invention relates to a conveyor device.

BACKGROUND ART

Conveyor devices are known as conveying devices configured to convey objects to be conveyed. Objects to be conveyed such as wafers and glass substrates used in semiconductor manufacturing devices or liquid crystal manufacturing devices may be conveyed in a manner accommodated in a front-opening unified pod (FOUP), for example, that is one of standardized containers. In conveying devices configured to convey such objects to be conveyed, in order to prevent damage, for example, of objects to be conveyed during conveyance, it is required to reduce vibration and wobble, for example, during conveyance to convey the objects in a stable state.

A conveyor device designed to convey objects to be conveyed in such a stable state is disclosed in Patent Literature 1, for example. Patent Literature 1 discloses a conveyor device in which a plurality of unit conveyors each having a belt driven in one direction by a drive pulley rotated by a drive device are arranged along a conveying direction. In this conveyor device, auxiliary conveyors each provided between the unit conveyors temporarily support objects to be conveyed to receive and deliver the objects to adjacent unit conveyors.

CITATION LIST

Patent Literature

[Patent Literature 1] Japanese Examined Patent Application Publication No. 6-2527

SUMMARY OF INVENTION

Technical Problem

In recent years, a conveyor device has been introduced in which a turning conveyor having a conveyor unit configured to turn on a substantially rectangular main unit to change the traveling direction of an object to be conveyed is disposed on a conveyance path. In such a conveyor device, it is required to stably receive and deliver the object to a section adjacent to the turning conveyor. However, even if a conventional auxiliary conveyor described above is simply disposed between the turning conveyor and the section adjacent to the turning conveyor, the auxiliary conveyor cannot be disposed closely to the turning conveyor because of the turning area of a turning portion in the turning conveyor. This makes it difficult to stably receive and deliver the object to the section adjacent to the turning conveyor.

In view of this, the present invention aims to provide a conveyor device that can stably receive and deliver an object to be conveyed to a section adjacent to a turning conveyor.

Solution to Problem

A conveyor device according to one aspect of the present invention includes: a first conveyor unit including a first supporting-and-conveying unit configured to support a bottom surface of an object to be conveyed to convey the object; a turning unit supporting the first conveyor unit and configured to turn the first conveyor unit to change a traveling direction of the object; and a second conveyor unit including a pair of second supporting-and-conveying units provided adjacently to the first conveyor unit and configured to support both ends of the bottom surface of the object in a width direction orthogonal to the conveying direction to convey the object. The pair of the second supporting-and-conveying units in the second conveyor unit and a driving-force transmitting unit configured to transmit driving force to the pair of the second supporting-and-conveying units in the second conveyor unit are provided outside a turning radius of the first conveyor unit in plan view. The first conveyor unit and the second conveyor unit are disposed so that a conveying area of the object in the second conveyor unit and a turning area of the first conveyor unit overlap each other in plan view.

In this conveyor device, because the pair of the second supporting-and-conveying units in the second conveyor unit and the driving-force transmitting unit configured to transmit driving force to the pair of the second supporting-and-conveying units in the second conveyor unit are provided outside the turning area of the first conveyor unit in plan view, the second conveyor unit does not hinder the turning of the first conveyor unit. The second supporting-and-conveying units in the second conveyor unit are not provided in a manner capable of supporting the whole surface of the object in the conveying area, but are provided in a manner capable of supporting only both side portions of the conveying area in the width direction. This makes it possible to dispose the first conveyor unit and the second conveyor unit so that the turning area of the first conveyor unit overlaps the conveying area of the object in the second conveyor unit while avoiding overlapping of the turning area of the first conveyor unit with the second supporting-and-conveying units in plan view. Accordingly, when the object is sent out to an adjacent section from the first conveyor unit, the second supporting-and-conveying units of the second conveyor unit and the first supporting-and-conveying unit of the first conveyor unit can be positioned closely to each other. Consequently, the object can be sent out to the section adjacent to the first conveyor unit as a turning conveyor via the second conveyor unit that is not a turning conveyor, and thus the object can be stably received and delivered.

In one embodiment, the first conveyor unit may include the first supporting-and-conveying unit provided in a pair and configured to support both ends of the bottom surface of the object in the width direction orthogonal to the conveying direction to convey the object.

In one embodiment, the first conveyor unit may be configured to turn with respect to a main unit provided below the first conveyor unit, and the second conveyor unit may be provided upon a base portion provided adjacently to the main unit and may be disposed so as to overlap the main unit in plan view.

In this conveyor device, because the base portion and the second conveyor unit can be members that are separated from the conveyor device or the first conveyor unit, layout change and maintenance for the conveyor device can be easily performed.

In one embodiment, the second supporting-and-conveying units may each have an object-supporting surface that is substantially parallel to a conveying surface of the object.

In this conveyor device, contact area between the second supporting-and-conveying units and the object can be secured, whereby the object can be stably conveyed.

Advantageous Effects of Invention

According to the present invention, the object can be stably received and delivered to the section adjacent to the turning conveyor.

DESCRIPTION OF EMBODIMENTS

One embodiment will now be described with reference to the drawings. In the description of the drawings, like reference signs are given to like or equivalent elements, and duplicated explanation is omitted. Dimensional ratios of the drawings do not necessarily match actual ones.

Figure 1:
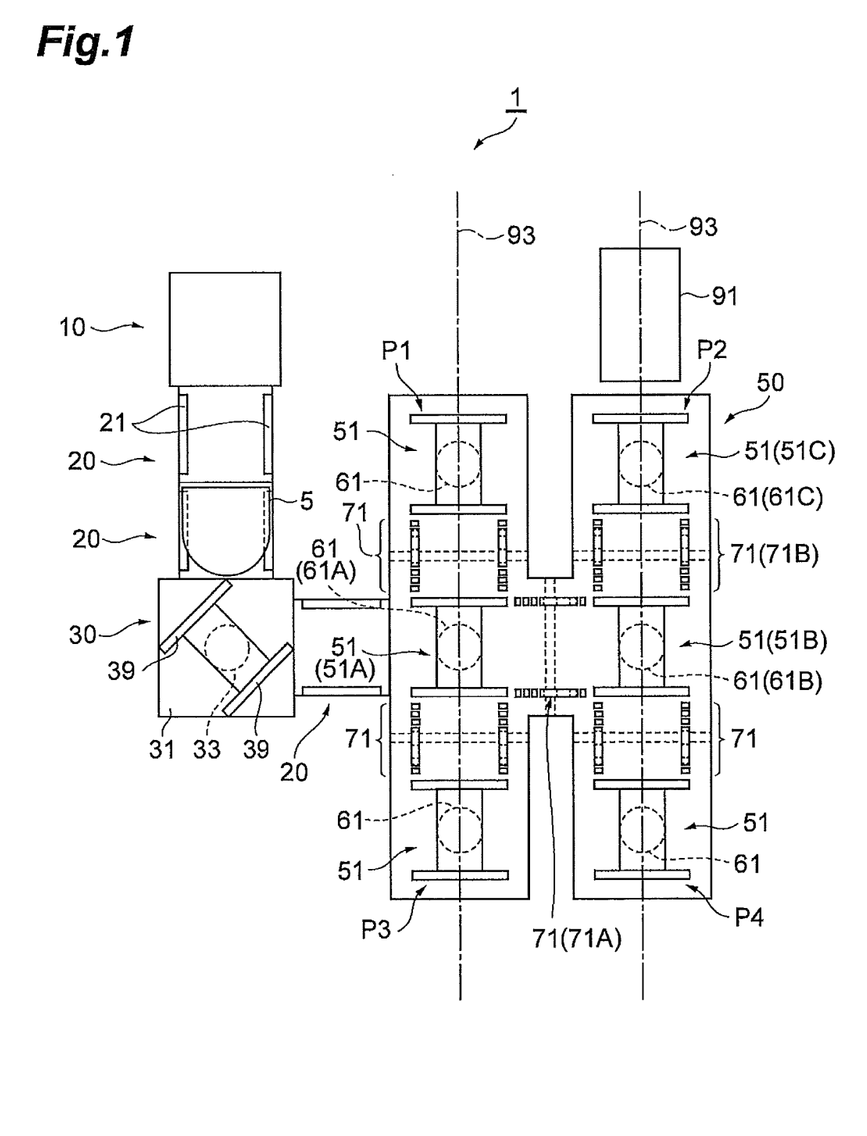
FIG. 1 is a configuration diagram of a conveying system including a conveyor device according to one embodiment.

FIG. 1 is a configuration diagram of conveying system 1 in which a conveyor device 50 according to one embodiment is used. The conveying system 1 is a system configured to convey a FOUP (object to be conveyed) 5 conveyed from an inter-level conveying device 10 to any one of transfer positions P1 to P4 that are positions for reception and delivery to an overhead traveling vehicle 91. As depicted in FIG. 1, the conveying system 1 of the present embodiment is provided with the transfer positions P1 to P4 at four locations. The FOUP 5 is a container configured to accommodate wafers and glass substrates, for example, used in a semiconductor manufacturing device or a liquid crystal manufacturing device, for example, and the FOUP 5 is one of standardized containers.

The inter-level conveying device 10 performs conveyance between different levels with a transfer device (not depicted). The overhead traveling vehicle 91 conveys a FOUP 5 between the transfer positions P1 to P4 and a load port (not depicted), for example. The overhead traveling vehicle 91 can be an overhead hoist transport (OHT) configured to hold and convey a FOUP 5 in a suspended state between the transfer positions P1 to P4 and the load port. The overhead traveling vehicle 91 travels along a traveling rail 93 provided at a position higher than a floor, e.g., at a ceiling of a clean room.

The following describes the conveying system 1 in which the conveyor device 50 according to one embodiment is used. As depicted in FIG. 1, the conveying system 1 includes the inter-level conveying device 10, conveying conveyors 20, a rotating conveyor 30, and a conveyor device 50.

The conveying conveyors 20 each have a pair of conveyor units 21 configured to support both ends of the bottom of a FOUP 5 in the width direction to convey the FOUP 5. The FOUP 5 is supported at the bottom surface and conveyed by the conveyor units 21. On the conveying conveyors 20 of the present embodiment, individual conveyance controls are performed by a control device (not depicted), for example. The conveying conveyors 20 are disposed between the inter-level conveying device 10 and the rotating conveyor 30, and also between the rotating conveyor 30 and the conveyor device 50.

The rotating conveyor 30 is a unit configured to change the conveying direction of the FOUP 5 and, as depicted in FIG. 1, has a pair of conveyor units 39 configured to support both ends of the bottom of the FOUP 5 in the width direction to convey the FOUP 5, a rotating mechanism 33 supporting the pair of conveyor units 39 and rotatably provided, and a main unit 31 supporting the rotating mechanism 33. For example, the rotating conveyor 30 sends out the FOUP 5 conveyed from the upper direction depicted in FIG. 1 toward the conveying conveyor 20 disposed in the right direction depicted in FIG. 1.

Figure 2:
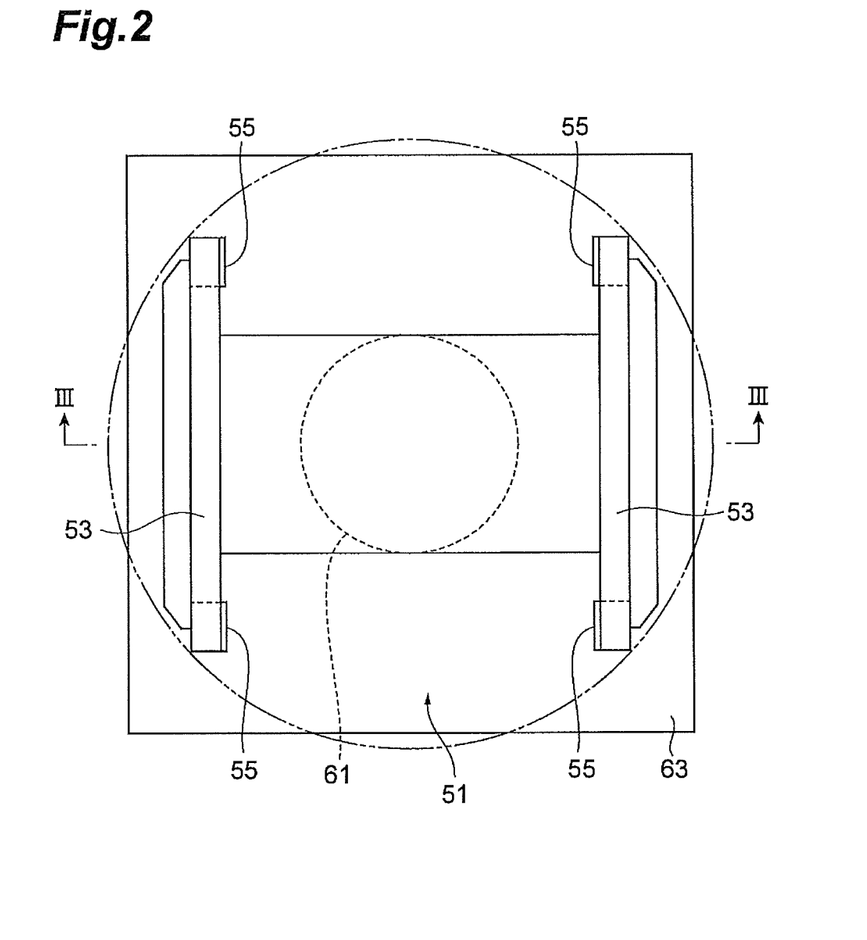
FIG. 2 is a plan view illustrating a first conveyor unit contained in FIG. 1.
Figure 3:
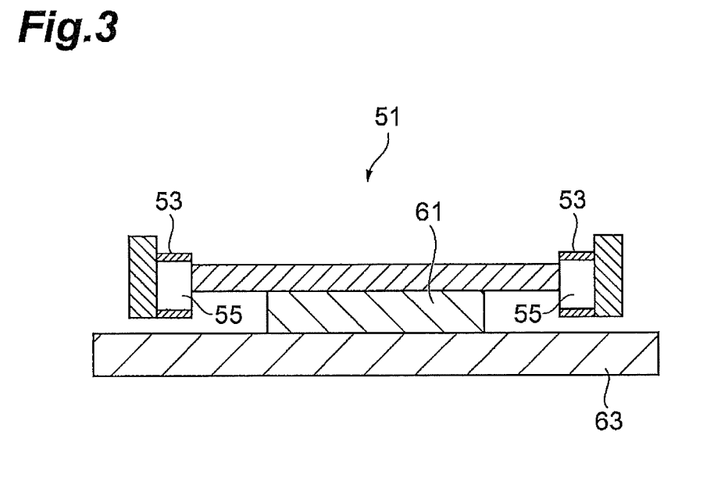
FIG. 3 is a sectional view of the first conveyor unit depicted in FIG. 2 along line III-III.
Figure 4:
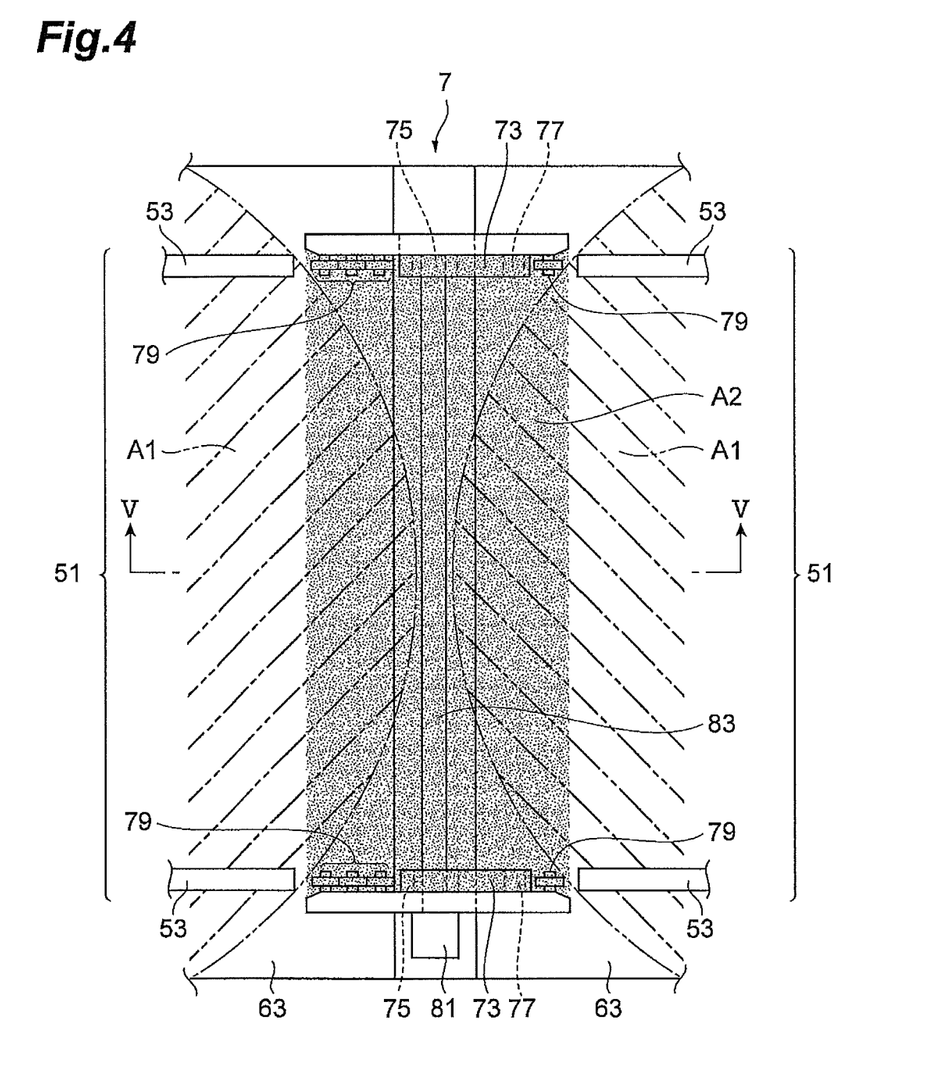
FIG. 4 is a plan view illustrating a second conveyor unit contained in FIG. 1.

The conveyor device 50 is a device configured to convey a FOUP 5 between this conveying conveyor 20 and the transfer positions P1 to P4. As depicted in FIG. 1, the conveyor device 50 mainly includes first conveyor units 51, turning units 61, and second conveyor units 71. Referring to FIG. 2 to FIG. 4, the conveyor device 50 will be described in detail below.

Figure 5:
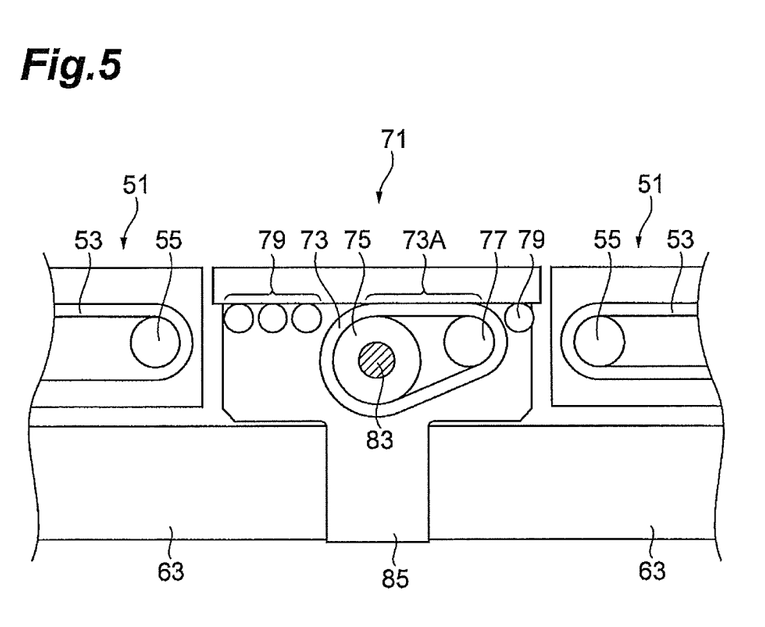
FIG. 5 is a sectional view of the second conveyor unit depicted in FIG. 4 along line V-V.

FIG. 2 is a plan view illustrating one of the first conveyor units 51. FIG. 3 is a sectional view of the first conveyor unit 51 depicted in FIG. 2 along line III-III. FIG. 4 is a plan view illustrating one of the second conveyor units 71, which illustrates a state when a FOUP 5 is received and delivered between the first conveyor units 51 and the second conveyor unit 71. FIG. 5 is a sectional view illustrating the second conveyor unit 71 depicted in FIG. 4 along line V-V, which illustrates a state when a FOUP 5 is received and delivered between the first conveyor units 51 and the second conveyor unit 71.

As depicted in FIG. 2 and FIG. 3, each first conveyor unit 51 has a pair of first belts (first supporting-and-conveying units) 53 configured to support both ends of the bottom of a FOUP 5 in the width direction to convey the FOUP 5. The pair of first belts 53 each are a ring-shaped endless belt, and each of the first belts 53 is wound around two rollers 55 and 55. At least one of the rollers 55 and 55 is driven by a drive unit (not depicted), whereby the respective first belts 53 are rotated in one direction to convey the FOUP 5 supported thereby.

Each turning unit 61 supports the corresponding first conveyor unit 51, and turns the first conveyor unit 51 to change the traveling direction of a FOUP 5. The turning unit 61 is rotated by a drive unit (not depicted) to turn the first conveyor unit 51 supported thereby. Each turning unit 61 is supported by the upper surface of a main unit 63. In other words, the first conveyor unit 51 supported by the turning unit 61 is provided in a manner capable of turning with respect to the main unit 63.

As depicted in FIG. 5, each second conveyor unit 71 is provided upon a base portion 85 provided adjacently to the main units 63 of the first conveyor units 51. The second conveyor unit 71 is provided so as to overlap the main units 63 in plan view as depicted in FIG. 4. As depicted in FIG. 4 and FIG. 5, each second conveyor unit 71 has a pair of second belts (second supporting-and-conveying units) 73 configured to support both ends of the bottom surface of a FOUP 5 in the width direction orthogonal to the conveying direction to convey the FOUP 5, drive rollers 75, driven rollers 77, and conveying rollers (second supporting-and-conveying units) 79.

As depicted in FIG. 4 and FIG. 5, the pair of the second belts 73 each are a ring-shaped endless belt, and each of the second belts 73 is wound around two rollers (the drive roller 75 and the driven roller 77 corresponding thereto). The drive roller 75 is driven by a drive unit 81 via a drive shaft (driving-force transmitting unit) 83. Each second belt 73 has a supporting surface (object-supporting surface) 73A that is substantially parallel to the conveying surface of the FOUP 5. The conveying rollers 79 each are a free roller to which driving force is not transmitted, and constitute part of the conveying surface of the FOUP 5.

In the present embodiment, as depicted in FIG. 4, the pair of the second belts 73 and the drive shaft 83 transmitting driving force to the second belts 73 in the second conveyor unit 71 are provided outside the turning areas A1 (diagonally hatched portions depicted in FIG. 4) of the first conveyor units 51 in plan view, in other words, at positions that do not overlap the turning areas A1.

In the present embodiment, the first conveyor units 51 and the second conveyor unit 71 are disposed so that the conveying area A2 (shaded portion depicted in FIG. 4) of the FOUP 5 in the second conveyor unit 71 and the turning areas A1 (diagonally hatched portions depicted in FIG. 4) of the first conveyor units 51 overlap each other in plan view as depicted in FIG. 4.

The following describes operation of the conveying system 1 when a FOUP 5 is conveyed from the inter-level conveying device 10 to the transfer position P2. In this case, the FOUP 5 in the conveyor device 50 travels along the following route. Specifically, as depicted in FIG. 1, the FOUP 5 is conveyed via the first conveyor unit 51A, the second conveyor unit 71A, the first conveyor unit 51B, the second conveyor unit 71B, and the first conveyor unit 51C in this order. The following description is made assuming that the inter-level conveying device 10 side is the upstream side and the transfer position P2 side is the downstream side.

To begin with, the conveying conveyor 20 to which a FOUP 5 has been received and delivered from the inter-level conveying device 10 drives the conveyor units 21 to convey the FOUP 5 downstream. The conveying conveyor 20 on the downstream side drives the conveyor units 21 when the FOUP 5 has been conveyed to the conveying conveyor 20 adjacent to the upstream side. The rotating conveyor 30 on the downstream side waits for the FOUP 5 to be conveyed thereto with the conveyor units 39 being faced toward the side from which the FOUP 5 is conveyed.

When the FOUP 5 has been conveyed to the conveying conveyor 20 adjacent to the upstream side, the rotating conveyor 30 drives the conveyor units 39. The rotating conveyor 30 to which the FOUP 5 has been received and delivered from the conveying conveyor 20 conveys the FOUP 5 to central portions of the conveyor units 39, and then temporarily stops driving the conveyor units 39. Subsequently, the rotating conveyor 30 drives the rotating mechanism 33 to rotate the conveyor units 39 counterclockwise, so that the conveyor units 39 are faced toward the conveying conveyor 20 adjacent to the downstream side. The conveyor units 39 are driven again to send out the FOUP 5 toward the conveying conveyor 20.

When the FOUP 5 has been conveyed to the rotating conveyor 30 adjacent to the upstream side, the conveying conveyor 20 drives the conveyor unit 21. The conveying conveyor 20 to which the FOUP 5 is received and delivered from the rotating conveyor 30 conveys the FOUP 5 toward the conveyor device 50 adjacent to the downstream side.

The first conveyor unit 51A of the conveyor device 50 drives the turning unit 61A so that the first belts 53 are faced toward the side from which the FOUP 5 is conveyed, and waits for the FOUP 5 to be conveyed thereto. When the FOUP 5 has been conveyed to the conveying conveyor 20 adjacent to the upstream side, the first conveyor unit 51A drives the first belts 53. The first conveyor unit 51A to which the FOUP 5 is received and delivered from the conveying conveyor 20 conveys the FOUP 5 to the second conveyor unit 71A disposed adjacently to the downstream side.

The second conveyor unit 71A drives the second belts 73 when the FOUP 5 has been conveyed to the first conveyor unit 51A adjacent to the upstream side. The second conveyor unit 71 to which the FOUP 5 has been received and delivered from the first conveyor unit 51A conveys the FOUP 5 to the first conveyor unit 51B disposed adjacently to the downstream side. The first conveyor unit 51B on the downstream side drives the turning unit 61B so that the first belts 53 are faced toward the side from which the FOUP 5 is conveyed, and waits for the FOUP 5 to be conveyed thereto.

The first conveyor unit 51B drives the first belts 53 when the FOUP 5 has been conveyed to the second conveyor unit 71A adjacent to the upstream side. The first conveyor unit 51B to which the FOUP 5 has been received and delivered from the second conveyor unit 71A conveys the FOUP 5 to central portions of the first belts 53, and then temporarily stops driving the first belts 53. Subsequently, the first conveyor unit 51B drives the turning unit 61B to rotate the first belts 53 counterclockwise, so that the first belts 53 are faced toward the second conveyor unit 71B adjacent to the downstream side. The first belts 53 are driven again to send out the FOUP 5 toward the second conveyor unit 71B.

Herein, the second belts 73, the conveying rollers 79, and the drive shaft 83 of the second conveyor unit 71B adjacent to the downstream side are disposed outside the conveying area A1 of the first conveyor units 51 as depicted in FIG. 4, and thus do not hinder the rotation when the first belts 53 are rotated counterclockwise. Furthermore, in the first conveyor unit 51B, when the first belts 53 are faced toward the second conveyor unit 71B adjacent to the downstream side, as depicted in FIG. 4, the first belts 53 can be positioned closely to the second belts 73 and the conveying rollers 79 of the second conveyor unit 71B. Thus, the FOUP 5 can be stably sent out toward the second conveyor unit 71B.

The second conveyor unit 71B drives the second belts 73 when the FOUP 5 has been conveyed to the first conveyor unit 51B adjacent to the upstream side. The second conveyor unit 71B to which the FOUP 5 has been received and delivered from the first conveyor unit 51B conveys the FOUP 5 to the first conveyor unit 51C disposed adjacently to the downstream side. The first conveyor unit 51C on the downstream side drives the turning unit 61C so that the first belts 53 are faced toward the side from which the FOUP 5 is conveyed, and waits for the FOUP 5 to be conveyed thereto.

The first conveyor unit 51C drives the first belts 53 when the FOUP 5 has been conveyed to the second conveyor unit 71B adjacent to the upstream side. The first conveyor unit 51C to which the FOUP 5 has been received and delivered from the second conveyor unit 71B conveys the FOUP 5 to central portions of the first belts 53, i.e., to the transfer position P2, and then temporarily stops driving the first belts 53. The FOUP 5 stopped at the transfer position P2 is held by the overhead traveling vehicle 91 and is conveyed to a predetermined load port.

In the conveyor device 50 of the above-described embodiment, as depicted in FIG. 4, because the pair of the second belts 73 and the conveying rollers 79 in each second conveyor unit 71 and the drive shaft 83 configured to transmit driving force to the second belts 73 are provided outside the turning area A1 (diagonally hatched portions depicted in FIG. 4) of each first conveyor unit 51 in plan view, the second conveyor unit 71 does not hinder the turning of the first conveyor unit 51. The second belts 73 in the second conveyor unit 71 are not provided in a manner capable of supporting the whole surface of the FOUP 5 in the conveying area A2 (shaded portion depicted in FIG. 4), but are provided in a manner capable of supporting only both side portions of the conveying area A2 in the width direction. This makes it possible to dispose the first conveyor unit 51 and the second conveyor unit 71 so that the turning area A1 of the first conveyor unit 51 overlaps the conveying area A2 of the FOUP 5 in the second conveyor unit 71 while avoiding overlapping of the turning area A1 of the first conveyor unit 51 with the second belts 73 and the conveying rollers 79 in plan view. Accordingly, when the FOUP 5 is sent out to an adjacent section from the first conveyor unit 51, the second belts 73 and the conveying rollers 79 of the second conveyor unit 71 and the first belts 53 of the first conveyor unit 51 can be positioned closely to each other. Consequently, the FOUP 5 can be sent out to the section adjacent to the first conveyor unit 51 as a turning conveyor via the second conveyor unit 71 that is not a turning conveyor, and thus the FOUP 5 can be stably received and delivered.

As depicted in FIG. 5, each first conveyor unit 51 of the above-described embodiment turns with respect to the main unit 63 provided below the first conveyor unit 51, and each second conveyor unit 71 is provided upon the base portion 85 provided adjacently to the main unit 63 and is disposed so as to overlap the main unit 63 in plan view. Accordingly, because the base portion and the second conveyor unit 71 can be members that are separated from the conveyor device 50 or the first conveyor unit 51, layout change and maintenance for the conveyor device can be easily performed.

Each second conveyor unit 71 of the above-described embodiment has the supporting surface 73A that is substantially parallel to the conveying surface of the FOUP 5, and thus contact area between the second conveyor unit 71 and the FOUP 5 can be secured, whereby the FOUP 5 can be stably conveyed.

In the foregoing, one embodiment of the present invention has been described, but the present invention is not limited to the above-described embodiment, and various modifications can be made without departing from the gist of the invention.

In the conveyor device 50 of the above-described embodiment, an example has been described in which the second supporting-and-conveying units of each second conveyor unit 71 include the second belts 73 and the conveying rollers 79, but the present invention is not limited to this. For example, in the plan view depicted in FIG. 4, in areas where the conveying rollers 79 convey the FOUP 5, the second belts 73 may be configured to convey the FOUP 5 instead.

In the conveyor device 50 of the above-described embodiment, an example has been described in which the pair of first belts 53 are provided in each first conveyor unit 51, but the present invention is not limited to this. For example, one belt capable of supporting the entire bottom surface of the FOUP (object to be conveyed) 5 may be provided instead.

In the conveyor device 50 of the above-described embodiment, an example has been described in which three first conveyor units 51 with turning units 61 and two second conveyor units 71 are disposed in the upper-and-lower direction in FIG. 1, and a combination of these units is disposed in two rows in the left-and-right direction, and also a second conveyor unit 71 is disposed between these combinations, but the present invention is not limited to this. The conveyor device 50 is only required to include at least one first conveyor unit 51, a turning unit 61 configured to turn this first conveyor unit 51, and at least one second conveyor unit 71 disposed adjacently to the first conveyor unit.

REFERENCE SIGNS LIST

1 . . . conveying system, 5 . . . FOUP (object to be conveyed), 10 . . . inter-level conveying device, 20 . . . conveying conveyor, 21 . . . conveyor unit, 30 . . . rotating conveyor, 31 . . . main unit, 33 . . . rotating mechanism, 39 . . . conveyor unit, 50 . . . conveyor device, 51 . . . first conveyor unit, 53 . . . first belt (first supporting-and-conveying unit), 55 . . . roller, 61 . . . turning unit, 63 . . . main unit, 71 . . . second conveyor unit, 73 . . . second belt (second supporting-and-conveying unit), 73A . . . supporting surface (object-supporting surface), 75 . . . drive roller, 77 . . . driven roller, 79 . . . conveying roller (second supporting-and-conveying unit), 81 . . . drive unit, 83 . . . drive shaft (driving-force transmitting unit), 85 . . . base portion, 91 . . . overhead traveling vehicle, 93 . . . traveling rail, A1 . . . turning area, A2 . . . conveying area, P1 to P4 . . . transfer position

The invention claimed is:

1. A conveyor device comprising:
a pair of first conveyor units;
a second conveyor unit comprising a pair of second supporting-and-conveying units configured to support both ends of the bottom surface of an object in a width direction orthogonal to the conveying direction to convey the object;
the pair of first conveyor units disposed at both ends of the second conveyor unit in the conveying direction of the object such that the second conveyor unit is interposed therebetween, the pair of the first conveyor units comprising a first supporting-and-conveying unit configured to support a bottom surface of the object to be conveyed to convey the object; and
a turning unit supporting the pair of the first conveyor units and configured to turn the pair of the first conveyor units to change a traveling direction of the object, wherein
the pair of the second supporting-and-conveying units in the second conveyor unit and a driving-force transmitting unit configured to transmit driving force to the pair of the second supporting-and-conveying units in the second conveyor unit are provided between the pair of the first conveyor units, disposed such that the second conveyor unit is interposed therebetween, and outside turning areas of the pair of the first conveyor units in plan view,
the pair of the first conveyor units and the second conveyor unit are disposed so that a conveying area of the object in the second conveyor unit and the turning areas of the pair of the first conveyor units overlap each other in plan view, and
the object is supported and conveyed only by the pair of the second supporting-and-conveying units between the pair of the first conveyor units disposed such that the second conveyor unit is interposed therebetween.

2. The conveyor device according to claim 1, wherein the first conveyor unit comprises the first supporting-and-conveying unit provided in a pair and configured to support both ends of the bottom surface of the object in the width direction orthogonal to the conveying direction to convey the object.

3. The conveyor device according to claim 2, wherein
the first conveyor unit is configured to turn with respect to a main unit provided below the first conveyor unit, and
the second conveyor unit is provided upon a base portion provided adjacently to the main unit and is disposed so as to overlap the main unit in plan view.

4. The conveyor device according claim 2, wherein the second supporting-and-conveying units each have an object-supporting surface that is substantially parallel to a conveying surface of the object.

5. The conveyor device according to claim 1, wherein
the first conveyor unit is configured to turn with respect to a main unit provided below the first conveyor unit, and
the second conveyor unit is provided upon a base portion provided adjacently to the main unit and is disposed so as to overlap the main unit in plan view.

6. The conveyor device according to any one of claim 5, wherein the second supporting-and-conveying units each have an object-supporting surface that is substantially parallel to a conveying surface of the object.

7. The conveyor device according to claim 1, wherein the second supporting-and-conveying units each have an object-supporting surface that is substantially parallel to a conveying surface of the object.

* * * * *